(12) United States Patent
Chittipeddi et al.

(10) Patent No.: US 6,358,785 B1
(45) Date of Patent: Mar. 19, 2002

(54) METHOD FOR FORMING SHALLOW TRENCH ISOLATION STRUCTURES

(75) Inventors: Sailesh Chittipeddi, Allentown, PA (US); Arun Kumar Nanda; Ankineedu Velaga, both of Orlando, FL (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/588,058

(22) Filed: Jun. 6, 2000

(51) Int. Cl.[7] .................. H01L 21/338; H01L 21/20
(52) U.S. Cl. ................. 438/174; 438/180; 438/392; 438/424
(58) Field of Search .................. 438/280, 174, 438/180, 301, 683, 951, 391, 392, 424

(56) References Cited

U.S. PATENT DOCUMENTS

| | | | | |
|---|---|---|---|---|
| 4,318,751 A | * | 3/1982 | Horng | 148/1.5 |
| 5,010,039 A | * | 4/1991 | Ku et al. | 437/228 |
| 5,316,978 A | * | 5/1994 | Boyd et al. | 437/203 |
| 5,364,810 A | * | 11/1994 | Kosa et al. | 437/42 |
| 5,618,745 A | * | 4/1997 | Kita | 438/164 |
| 5,918,130 A | * | 6/1999 | Hause et al. | 438/220 |
| 6,207,494 B1 | * | 3/2001 | Graimann et al. | 438/248 |

* cited by examiner

Primary Examiner—Michael Lebentritt
(74) Attorney, Agent, or Firm—Christie, Parker & Hale, LLP

(57) ABSTRACT

A method for forming a shallow trench isolation structure within a semiconductor substrate includes forming a trench opening within a semiconductor substrate having an oxidation-resistant material as a top surface. An oxide liner is formed on inner surfaces of the trench opening. A silicon material is then introduced into the trench opening and over the top surface. The silicon material is subsequently oxidized, either before or after a polishing operation is used to planarize the structure. Dishing related problems are avoided during polishing because the silicon or oxidized silicon material has a polishing rate similar to the oxidation resistant material, and less than that of conventionally formed CVD oxides.

18 Claims, 2 Drawing Sheets

METHOD FOR FORMING SHALLOW TRENCH ISOLATION STRUCTURES

TECHNICAL FIELD

The present invention relates most generally to semiconductor devices and methods for forming the same. More particularly, the present invention relates to a method for forming shallow trench isolation (STI) structures.

BACKGROUND OF THE INVENTION

In today's advancing semiconductor manufacturing processing technology, the multitude of components which combine to form an integrated circuit device are being formed in increasingly closer proximity. In order to avoid adjacent devices from shorting to one another, and in order to avoid leakage between devices formed in close proximity to one another, STI structures have become a commonly used feature in the semiconductor manufacturing industry.

STI structures are typically formed by producing a trench-like opening in a substrate, then filling the trench-like opening with an insulating material. The insulating materials may be formed by various chemical vapor deposition (CVD) techniques such as low pressure chemical vapor deposition (LPCVD), high density plasma (HDP) deposition, or any other suitable method for depositing an insulating material within a trench opening. After the opening is filled with a deposited insulating material, a planarizing process such as chemical mechanical polishing is used to planarize the structure by removing any portions of the insulating material which are formed above the upper plane beneath which the trench opening extends.

Nitride (silicon nitride—$Si_3N_4$) or other oxidation resistant, and suitably hard films, are typically used as films which form the upper surface beneath which the trench opening extends. Hard films are favored because of their resistance to polishing during the polishing operations used to planarize the STI structures. Such films have relatively low polishing rates and may be referred to as polishing-stop layers.

During the formation of STI structures, problems arise when the polishing operations used to planarize the STI structure cause "dishing" on the top of the STI structure. Dishing describes the phenomena wherein the top surface of the insulating material within the trench becomes recessed below the upper surface of the polishing-stop layer such as silicon nitride. Dishing results because the deposited insulating materials which are formed by any of various CVD techniques to fill the trenches, have a higher polishing rate than the polishing-stop layers used. In order to ensure complete removal of the deposited insulating material from over the polishing-stop layer, a sufficient amount of polishing is used which results in the upper surface of the deposited insulating material becoming recessed within the trench and below the surface of the polishing-stop layer.

As a result of dishing, the central portion of the top surface of the STI structure is typically recessed below the peripheral portion of the top surface of the STI structure. The peripheral edges of the insulating material within the trench generally extend up the side of the trench opening to intersect the upper surface of the polishing-stop layer at the edges of the trench opening. Sharp, upward projections may therefore result at these peripheral edges. The central portion of the top surface of the STI structure may be recessed by as many as 500 angstroms with respect to the edges of the STI structure due to dishing. After the nitride polishing-stop layer is subsequently removed and the entire top portion of the STI structure uniformly recessed, the 500 angstrom height difference remains on the top of the STI structure.

After the STI structure is completed, the sharp, upward projections may also remain at the edges of the STI structure which may additionally extend above the upper surface of the semiconductor substrate. These projections may extend above the bulk of the STI structure by as much as 500 angstroms, and may extend above the surrounding semiconductor substrate by an even greater distance. Polysilicon films are commonly used to form transistor gates and to serve other interconnection functions in semiconductor integrated circuits. At the location where the polysilicon film extends over the sharp upward projections created at the peripheries of STI structures due to dishing, a localized electric field is created. The same is true when semiconductor materials other than polysilicon, are used as interconnection materials. Such a localized electric field is highly undesirable as it may produce various electrical parametric problems throughout the device. For example, such an electric field formed in a transistor gate may significantly lower the threshold voltage, $V_t$, for a MOSFET (Metal Oxide Semiconductor Field Effect Transistor) device. These sharp, upward projections in the STI structure created by dishing can cause other electrical problems which may result in device failure, or which may require additional implants to compensate for changed parametric characteristics, or both.

It can therefore be seen that there is a need for a process for forming shallow trench isolation structures having planar upper surfaces and which do not exhibit dishing-related problems.

SUMMARY OF THE INVENTION

To achieve these and other objects, and in view of its purposes, the present invention addresses the shortcomings of the processes for forming shallow trench isolation structures known to the prior art and provides an improved process for forming superior shallow trench isolation structures which do not exhibit dishing related problems. The present invention describes materials, processes, and structures used to produce low leakage STI structures having substantially planar upper surfaces. The present invention provides a method for employing a silicon film as the trench fill material, then polishing the silicon film in its as-deposited or oxidized form. The silicon or oxidized silicon material has a polishing rate which is more similar to that of the film used as the polishing-stop layer than an insulating film deposited using conventional CVD methods. As such, the polishing operation produces a material within the trench having a substantially planarized upper surface. If the silicon is polished in its as-deposited form, a subsequent oxidation step is used to convert the silicon material to a silicon dioxide material using principles similar to LOCOS oxidation. The production of shallow trench isolation structures having planar upper surfaces precludes the subsequent formation of localized electric fields and therefore produces devices which are less prone to leakage and other parametric failures.

It is to be understood that both the foregoing general description and the following detailed descriptions are exemplary, but not restrictive of the invention.

BRIEF DESCRIPTION OF THE DRAWING

The invention is best understood from the following detailed description when read in connection with the accompanying drawing. It is emphasized that, according to common practice, the various features of the drawing are not to-scale. On the contrary, the dimensions of the various features are arbitrarily expanded or reduced for clarity. Included in the drawing are the following figures:

FIGS. 1, 2, 3, 4B, 5, and 6 show a sequence of processing operations used to form a shallow trench isolation structure according to a second exemplary embodiment of the invention.

Each of the figures is a cross-sectional view.

Figure 1:
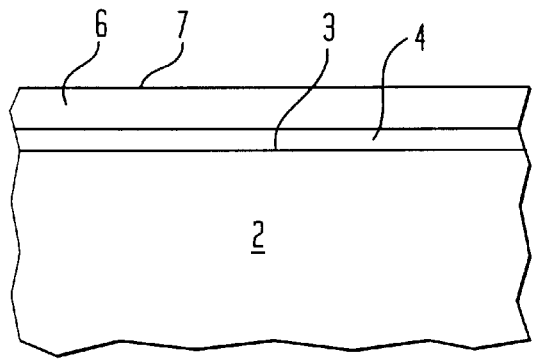
FIGS. 1, 2, 3, 4A, 5, and 6 show a sequence of process operations used to form a shallow trench isolation structure according to a first exemplary embodiment of the invention.
Figure 2:
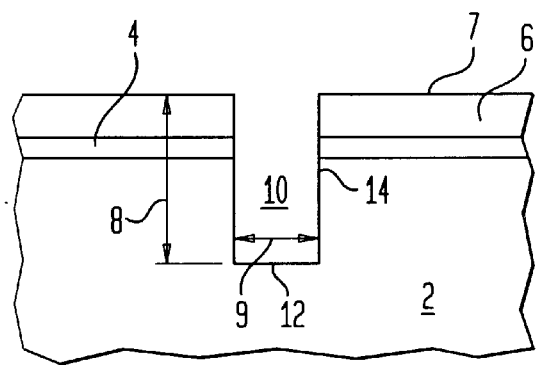
Figure 3:
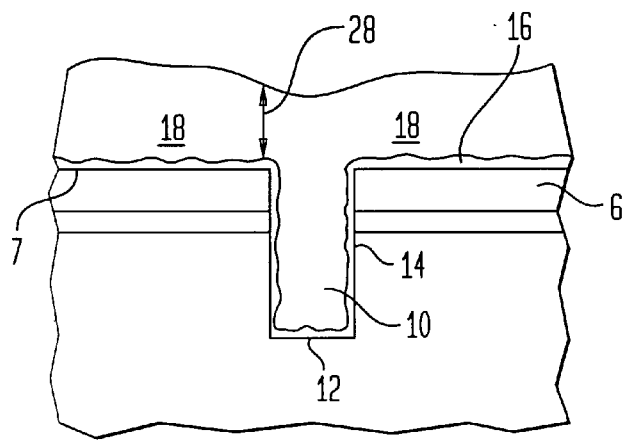
Figure 4A:
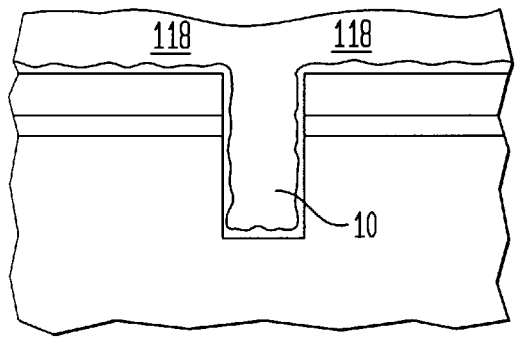
Figure 4B:
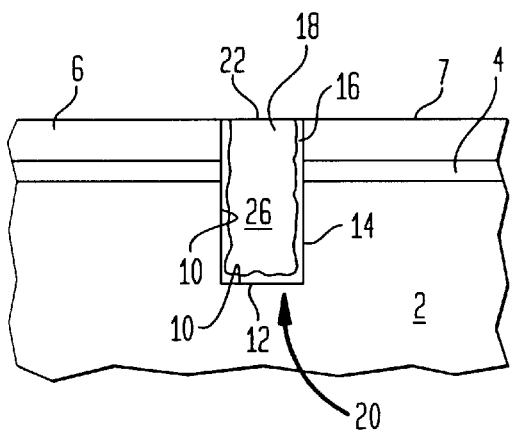
Figure 5:
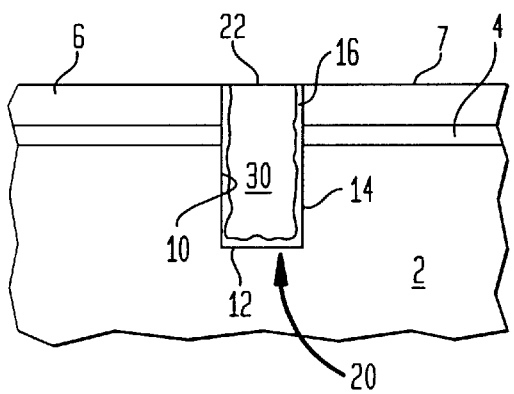

FIG. 1 shows a pad oxide film and an oxidation resistant film formed over a semiconductor substrate;

FIG. 2 shows a trench opening formed within the structure shown in FIG. 1;

FIG. 3 shows the trench opening of FIG. 2 filled with an oxide liner and a silicon film;

FIG. 4A shows the silicon film shown in FIG. 3 after it has been thermally oxidized to form a silicon dioxide film;

FIG. 4B shows the structure shown in FIG. 3, after it has been planarized;

FIG. 5 shows a trench opening filled with silicon dioxide; and

Figure 6:
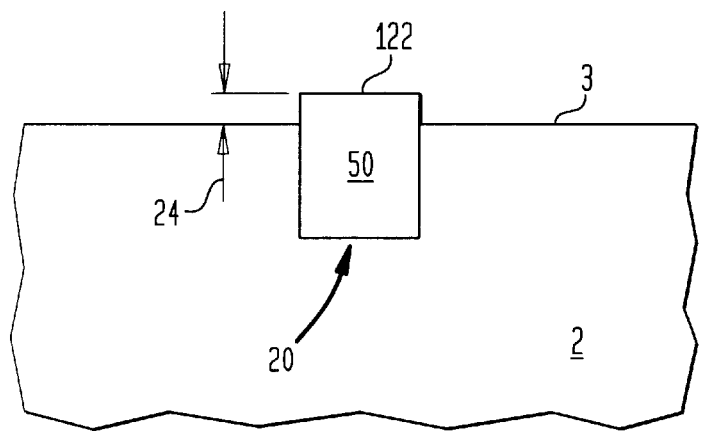

FIG. 6 shows the shallow trench isolation structure after the pad oxide and oxidation resistant films have been removed from over the substrate.

DETAILED DESCRIPTION OF THE INVENTION

The present invention takes advantage of the fact that a deposited silicon film, in its as-deposited or oxidized form, has a polishing rate which is less than that of a dielectric film deposited using conventional chemical vapor deposition (CVD) methods. The present invention provides for forming a shallow trench isolation structure by forming a trench opening within a substrate having an upper surface of a hard, oxidation resistant film, then filling the trench opening with a silicon film such as polysilicon or amorphous silicon. According to a first exemplary embodiment, the silicon film is oxidized, then polished using methods such as chemical mechanical polishing (CMP) to produce a shallow trench isolation structure consisting of a silicon dioxide material formed within the trench opening and having a planar top surface which is substantially coplanar with the upper surface of the hard, oxidation resistant film.

According to a second exemplary embodiment of the invention, the silicon film is first polished using methods such as CMP to produce a silicon plug which remains in the trench opening and has a planar top surface which is substantially coplanar with the upper surface of the hard, oxidation resistant film. The structure is then oxidized according to LOCOS (local oxidation of silicon) principles. According to this second exemplary embodiment, the polysilicon material which remains within the trench is converted to silicon dioxide material thereby forming the shallow trench isolation structure.

Now turning to the drawing, FIG. 1 is an exemplary embodiment of an oxidation resistant film 6 formed over dielectric film 4 which, in turn, is formed over substrate 2. In the preferred embodiment, substrate 2 may be a silicon wafer commonly used in the semiconductor manufacturing industry. According to other exemplary embodiments, substrate 2 may be formed of other semiconductor materials. Substrate 2 includes substrate surface 3. Dielectric film 4 is a thermally formed oxide film which may be referred to as a pad oxide film, according to the preferred embodiment, but other suitable oxide and dielectric films may be used alternatively. Oxidation resistant film 6 includes top surface 7. According to an exemplary embodiment, dielectric film 4 may have a thickness ranging from 50 to 200 angstroms, but other suitable film thicknesses may be used alternatively.

The uppermost, oxidation resistant film 6 will be a silicon nitride film according to the preferred embodiment, but other oxidation resistant films which are relatively hard and resistant to polishing may be used in alternative exemplary embodiments. Although oxidation resistant film 6 may be a film other than silicon nitride in various alternative embodiments, hereinafter oxidation resistant film 6 will be referred to as silicon nitride, or simply nitride film 6. Nitride film 6 may include a thickness within the range of 1000 to 2500 angstroms. Dielectric film 4 will hereinafter be referred to as pad oxide film 4, but it is to be understood that such use is exemplary only, and other suitable dielectric films may be used alternatively. In an exemplary embodiment, the total thickness of pad oxide film 4 and nitride film 6 may range from 1600 to 2000 angstroms, but other thicknesses may be used alternatively.

Now turning to FIG. 2, trench opening 10 is shown as formed extending down from top surface 7 of nitride film 6. It can be seen that trench opening 10 extends through nitride film 6 and pad oxide film 4 and into substrate 2. According to an exemplary embodiment, any of various etching procedures such as reactive ion etching may be used to form trench opening 10. Trench opening 10 includes trench depth 8 and trench width 9. Trench depth 8 and trench depth 9 are generally chosen so that an aspect ratio, defined as [trench depth 8: trench width 9] does not exceed 6.0, but other configurations may be used. Trench width 9 may be 0.1 microns to 2.0 microns, and may be 0.1 to 0.5 microns according to an exemplary embodiment. Trench depth 8 may be as great as 1 micron and may range from 4500 angstroms to 6500 angstroms according to various exemplary embodiments. It should be emphasized at this point that the dimensions and relative dimensions of the features herein described, are intended to be exemplary only and not restrictive of the present invention. Trench opening 10 is defined by its inner surfaces which include bottom surface 12 and sidewalls 14.

FIG. 3 shows trench opening 10 shown in FIG. 2, after it has been filled by oxide liner 16 and silicon film 18. Oxide liner 16 is formed over top surface 7 of nitride film 6 and also over sidewalls 14 and bottom surface 12 of now-filled trench opening 10. Oxide liner 16 may include a thickness within the range of 50–100 angstroms in an exemplary embodiment, but other thicknesses may be used alternatively. It can be seen that oxide liner 16 does not completely fill trench opening 10. Oxide liner 16 may be formed using any of various CVD processes according to various exemplary embodiments. According to a preferred embodiment, high density plasma (HDP) deposition processes may be used to form oxide liner 16. Oxide liner 16 will be a silicon dioxide material which may additionally include dopant impurities according to various exemplary embodiments.

Silicon film 18 is formed sequentially after oxide liner 16 and is a generally conformal film. Silicon film 18 is formed over nitride film 6, and over oxide liner 16. Silicon film 18 fills trench opening 10. Thickness 28 of silicon film 18 is chosen to ensure that silicon film 18 completely fills trench opening 10. It can be understood that thickness 28 will vary according to various exemplary embodiments depending on the depth of the trench opening which must filled. Conventional CVD methods such as PECVD (plasma enhanced chemical vapor deposition) and LPCVD (low pressure chemical vapor deposition) may be used to form generally conformal silicon film 18. Silicon film 18 may be a polycrystalline silicon film (polysilicon), or it may an amorphous silicon film. As will be seen in FIGS. 4A and 5, silicon film 18 will subsequently be thermally oxidized and become converted into a silicon dioxide material. Silicon film 18 may additionally be doped with any of various suitable impurities.

Various methods for introducing dopant impurities into silicon film 18 may be used. Such methods include ion implantation and various diffusion methods. In an exemplary embodiment, silicon film 18 may be doped with phosphorous. According to this exemplary embodiment, silicon film 18 may be doped with a phosphorous impurity by heating the film after it has been formed, in an environment including $POCl_3$. Other dopant impurities and other methods for introducing the dopant impurities into silicon film 18, may be used alternatively. For example, the $POCl_3$ doping procedure may be carried out concurrently with the formation of silicon film 18. The level of doping and the specific dopant impurity chosen will be determined in conjunction with the thermal oxidation conditions which will be used to subsequently oxidize silicon film 18 after the dopant impurities have been introduced.

First Exemplary Embodiment

According to the first exemplary embodiment of the method of the present invention, after silicon film 18 is formed to fill trench opening 10, silicon film 18 is oxidized. In this manner, silicon film 18 shown in FIG. 3 is converted into silicon dioxide film 118 as shown in FIG. 4A, including portions of silicon dioxide film 118 within now-filled trench opening 10. Thermal oxidation time and conditions will be chosen to insure that substantially all portions of silicon film 18 which are in now-filled trench opening 10, are completely oxidized to form silicon dioxide film 118.

Various thermal oxidation conditions may be used. As discussed above, according to the exemplary embodiment wherein silicon film 18 shown in FIG. 3 is doped, the thermal oxidation conditions may be chosen in conjunction with the doping characteristics of silicon film 18. According to various exemplary embodiments, the thermal oxidation procedure may be carried out using RTA (rapid thermal anneal) procedures or it may be carried out using a furnace oxidation procedure. The thermal oxidation temperature may be a temperature within the range of 550° C. to 1100° C. according to various exemplary embodiments. According to a preferred embodiment, the thermal oxidation temperature may be within the range of 800° C. to 900° C. Thermal oxidation time will vary according to film thickness, doping characteristics, and method and temperature of oxidation. According to an exemplary embodiment, the time used for performing a thermal oxidation procedure using a diffusion furnace may range from 30 minutes to 150 minutes, and the thermal oxidation time used in conjunction with an RTA oxidation process may range from 5 seconds to 5 minutes.

Now turning to FIG. 5, a planarization process is used to remove portions of silicon dioxide film 118 from over the plane formed by top surface 7 of nitride film 6. Various polishing methods such as CMP may be used. Portions of silicon dioxide film 118 shown in FIG. 4A, which remain in now-filled trench opening 10 after polishing, form silicon dioxide plug 30. Silicon dioxide plug 30 is bounded laterally and subjacently by oxide liner 16 which is interposed between silicon dioxide plug 30 and the inner surfaces of original trench opening 10 which include bottom 12 and sidewalls 14. Together, silicon dioxide plug 30 and oxide liner 16 formed within now-filled trench opening 10, form STI structure 20. It can be seen that planar top surface 22 of silicon dioxide plug 30 is substantially coplanar with top surface 7 of nitride film 6. The polishing operation effectively removes all portions of silicon dioxide film 118 from over the plane formed by top surface 7 of nitride film 6. Because the silicon dioxide film 118 includes a polishing rate which is similar to that of nitride film 6 in the polishing conditions used, a substantially planarized surface including top surfaces 7 and 22 is produced. Dishing-related problems are avoided.

It can be seen that STI structure 20 extends through nitride film 6 and pad oxide film 4 and into substrate 2.

Second Exemplary Embodiment

According to a second exemplary embodiment of the method of the present invention, after silicon film 18 is formed as shown in FIG. 3, the structure is polished, prior to oxidation, to form the structure shown in FIG. 4B. Referring now to FIG. 4B, it can be seen that portions of original silicon film 18 have been removed from above the plane formed by top surface 7 of nitride film 6. In the preferred embodiment, CMP may be used to planarize the structure, but other polishing methods may be used alternatively. Portions of original silicon film 18 which remain in now-filled trench opening 10 after polishing, form silicon plug 26. Silicon plug 26 includes a planar top surface 22 which is substantially coplanar with top surface 7 of nitride film 6. Silicon plug 26 is bounded laterally and subjacently by oxide liner 16. Because silicon film 18 includes a polishing rate which is similar to that of nitride film 6 in the polishing conditions used, a substantially planarized surface including top surfaces 7 and 22, is produced. Dishing-related problems are therefore avoided.

The structure shown in FIG. 4B is then subject to thermal oxidation as described in conjunction with FIG. 4A. The thermal oxidation procedure converts silicon plug 26 into a silicon dioxide material. LOCOS principles apply because the silicon plug 26 which is being oxidized, is formed within nitride film 6 which is an oxidation resistant material. The resultant structure includes silicon dioxide plug 30 which is formed from silicon plug 26. This structure is shown in FIG. 5, which is as described in conjunction with the first exemplary embodiment. Thermal oxidation conditions are chosen to insure that essentially all of silicon plug 26 is oxidized to form silicon dioxide plug 30.

According to the process of the second exemplary embodiment, silicon plug 26 shown in FIG. 4B may "mushroom" when thermally oxidized to form silicon dioxide plug 30, according to the second exemplary embodiment. If mushrooming occurs, the structure shown in FIG. 5 will include a raised top surface of STI structure 20 which extends above top surface 7. The raised top surface will maintain a substantially planar character. If this occurs, an additional polishing operation may be carried out to planarize the structure and produce the structure shown in FIG. 5. According to another exemplary embodiment not shown in FIG. 5, the elevated upper surface of STI structure 20 may be allowed to remain as formed. At any rate, with a raised upper surface or the substantially coplanar upper surface 22 shown in FIG. 5 and which may be formed according to either of the first or second exemplary embodiments, dishing related issues are avoided. The STI structure 20 produced according to either of the first and second exemplary embodiments, does not include a top surface which is receded below top surface 7 of nitride film 6.

Now turning to FIG. 6, nitride film 6 and pad oxide film 4 are successively removed from the structure shown in FIG.

5 to expose substrate surface 3 of substrate 2. Conventional methods may be used to successively remove the nitride and pad oxide films. The procedure used to remove pad oxide film 4 will also recede the top surface of STI structure 20 which may also be an oxide material. Receded top surface 122 results, and may extend by distance 24 above substrate surface 3, or according to another exemplary embodiment, upper surface 122 may be substantially coplanar with substrate surface 3. It should be noted that STI structure 20 includes a silicon dioxide material 50 formed within original trench opening 10. Silicon dioxide material 50 is shown as a single material to emphasize that oxide liner 16 and silicon dioxide plug 30 collectively form a continuous plug of silicon dioxide material.

It is emphasized at this point that the present invention is not intended to be limited to the exemplary embodiments shown. Rather, the present invention is intended to cover the formation of STI structures by filling a trench opening with a silicon film, then polishing portions of the silicon film in its as-deposited or oxidized form, to form an STI structure which does not include dishing-related problems.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principals of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents such as equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed:

1. A method for forming a shallow trench isolation structure within a semiconductor substrate, comprising the steps of:
    (a) providing a base semiconductor substrate having an oxidation resistant film formed thereover and a trench opening extending through said oxidation resistant film and into said base semiconductor substrate;
    (b) depositing a silicon dioxide liner on inner surfaces of said trench opening, but not filling said trench opening;
    (c) filling said trench opening with silicon; and
    (d) thermally oxidizing said silicon thereby converting substantially all of said silicon to silicon dioxide.

2. The method as in claim 1, wherein step (c) comprises forming a polysilicon film over said oxidation resistant film and filling said trench opening, step (d) comprises thermally oxidizing said polysilicon film thereby converting said polysilicon film to a silicon dioxide film, and
    further comprising step (e) polishing thereby removing portions of said silicon dioxide film from over a plane formed by an upper surface of said oxidation resistant film, thereby forming a plug of said silicon dioxide within said trench opening, said plug having a top surface being substantially coplanar with said upper surface of said oxidation resistant film.

3. The method as in claim 2, wherein said step (e) comprises chemical mechanical polishing.

4. The method as in claim 1, in which said step (c) includes forming a polysilicon film over said oxidation resistant film and filling said trench opening, then polishing thereby removing portions of said polysilicon film from over a plane formed by an upper surface of said oxidation resistant film.

5. The method as in claim 4, wherein said polishing comprises chemical mechanical polishing.

6. The method as in claim 1, in which step (a) includes providing a pad oxide film interposed between said base semiconductor substrate and said oxidation resistant film and wherein said trench opening extends through said oxidation resistant film and said pad oxide film and into said base semiconductor substrate.

7. The method as in claim 1, wherein said step (c) comprises filling said trench opening with polycrystalline silicon.

8. The method as in claim 1, wherein said step (c) comprises filling said trench opening with amorphous silicon.

9. The method as in claim 1, further comprising step (c1) introducing phosphorous as a dopant impurity into said silicon.

10. The method as in claim 9, wherein said introducing comprises heating said silicon in an environment of $POCl_3$.

11. The method as in claim 1, in which said step (d) includes heating to a temperature within the range of 550° C. to 1100° C. for a time within the range of 30 minutes to 150 minutes.

12. The method as in claim 1, in which said step (d) includes heating for a time sufficient to convert said silicon within said trench opening to said silicon dioxide.

13. The method as in claim 1, in which step (b) includes depositing said silicon dioxide liner using high density plasma (HDP) deposition, and forming said silicon dioxide liner to a thickness within the range of 50–100 angstroms.

14. The method as in claim 1, wherein said oxidation resistant film comprises silicon nitride.

15. The method as in claim 1, further comprising step (e) removing said oxidation resistant film.

16. The method as in claim 1, in which said step (a) includes forming said trench opening by etching through said oxidation resistant film and into said base semiconductor substrate, and wherein said trench opening includes a depth within the range of 4500 angstroms to 6500 angstroms and a width within the range of 0.1 to 2 microns.

17. A method for forming a shallow trench isolation structure within a semiconductor substrate, comprising the steps of:
    (a) providing a base semiconductor substrate and a pad oxide film formed thereover, a silicon nitride film formed over said pad oxide film, and a trench opening extending through said silicon nitride film and said pad oxide film and into said base semiconductor substrate;
    (b) depositing a silicon dioxide liner on inner surfaces of said trench opening, but not filling said trench opening;
    (c) forming a polysilicon film over said silicon nitride film and filling said trench opening;
    (d) polishing using chemical mechanical polishing, thereby removing portions of said polysilicon film which are formed over a plane formed by an upper surface of said silicon nitride film; and (e) converting substantially all of said polysilicon film which remains in said trench opening to a silicon dioxide film by heating to a temperature within the range of 550° C. to 1100° C. for a time within the range of 30 minutes to 150 minutes, thereby thermally oxidizing said polysilicon film which remains in said trench opening.

18. A method for forming a shallow trench isolation structure within a semiconductor substrate, comprising the steps of:

(a) providing a base semiconductor substrate and a pad oxide film formed thereover, a silicon nitride film formed over said pad oxide film, and a trench opening extending through said silicon nitride film and said pad oxide film and into said base semiconductor substrate;

(b) depositing a silicon dioxide liner on inner surfaces of said trench opening, but not filling said trench opening;

(c) forming a polysilicon film over said silicon nitride film and filling said trench opening;

(d) thermally oxidizing said polysilicon film by heating to a temperature within the range of 550° C. to 1100° C. for a time within the range of 30 minutes to 150 minutes, thereby converting substantially all of said polysilicon film to a silicon dioxide film; and (e) polishing using chemical mechanical polishing, thereby removing portions of said silicon dioxide film which are formed over a plane formed by an upper surface of said silicon nitride film.

* * * * *